United States Patent
Pichler et al.

(10) Patent No.: US 12,170,226 B2
(45) Date of Patent: Dec. 17, 2024

(54) METHOD FOR SEPARATING DIES FROM A SEMICONDUCTOR SUBSTRATE

(71) Applicant: Infineon Technologies AG, Neubiberg (DE)

(72) Inventors: Franz-Josef Pichler, Villach (AT); Benjamin Bernard, Woerth (DE); Mario Stefenelli, Freiberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/620,327

(22) Filed: Mar. 28, 2024

(65) Prior Publication Data
US 2024/0339361 A1    Oct. 10, 2024

(30) Foreign Application Priority Data
Apr. 5, 2023 (DE) .......................... 102023108751.7

(51) Int. Cl.
*H01L 21/82* (2006.01)
*H01L 21/02* (2006.01)
(Continued)

(52) U.S. Cl.
CPC .... *H01L 21/8213* (2013.01); *H01L 21/02118* (2013.01); *H01L 21/268* (2013.01);
(Continued)

(58) Field of Classification Search
CPC ........... H01L 21/8213; H01L 21/02118; H01L 21/268; H01L 21/304; H01L 21/324;
(Continued)

(56) References Cited

U.S. PATENT DOCUMENTS

| | | | | |
|---|---|---|---|---|
| 8,722,516 B2 * | 5/2014 | Yamada | ............. | B23K 26/0853 438/33 |
| 8,728,914 B2 * | 5/2014 | Sakamoto | .......... | B23K 26/0622 438/662 |

(Continued)

FOREIGN PATENT DOCUMENTS

| | | |
|---|---|---|
| DE | 102016214985 A1 | 2/2017 |
| DE | 102016224978 A1 | 6/2018 |
| WO | 2015052217 A1 | 4/2015 |

*Primary Examiner* — Vu A Vu
(74) *Attorney, Agent, or Firm* — Murphy, Bilak & Homiller, PLLC

(57) ABSTRACT

A method for separating dies from a semiconductor substrate having dies adjoining a first surface of the substrate includes: attaching the substrate to a carrier via the first surface; generating first modifications by introducing laser irradiation into an interior of the substrate via a second surface of the substrate, the first modifications extending between the first surface and a vertical level in the interior that is being spaced from the second surface, the first modifications laterally surrounding the dies; generating second modifications by introducing laser irradiation into the interior via the second surface, the second modifications sub-dividing the substrate into a first part between the first surface and the second modifications, and a second part between the second surface and the second modifications; separating the parts along a first separation area defined by the second modifications; and separating the dies along a second separation area defined by the first modifications.

21 Claims, 5 Drawing Sheets

(51) Int. Cl.
*H01L 21/268* (2006.01)
*H01L 21/304* (2006.01)
*H01L 21/324* (2006.01)
*H01L 21/683* (2006.01)
*H01L 29/16* (2006.01)

(52) U.S. Cl.
CPC .......... *H01L 21/304* (2013.01); *H01L 21/324* (2013.01); *H01L 21/6836* (2013.01); *H01L 29/1608* (2013.01); *H01L 2221/68309* (2013.01); *H01L 2221/68327* (2013.01); *H01L 2221/68381* (2013.01)

(58) Field of Classification Search
CPC ............. H01L 21/6836; H01L 29/1608; H01L 2221/68309; H01L 2221/68327; H01L 2221/68381
USPC ........................................................ 438/458
See application file for complete search history.

(56) References Cited

U.S. PATENT DOCUMENTS

| | | | |
|---|---|---|---|
| 8,796,114 B2* | 8/2014 | Wagner | C30B 33/06 438/464 |
| 8,815,705 B2* | 8/2014 | Kato | B23K 26/0622 438/463 |
| 10,319,598 B2* | 6/2019 | Kim | B23K 26/702 |
| 10,758,999 B2* | 9/2020 | Okuma | B23K 26/0006 |
| 10,828,726 B2* | 11/2020 | Hirata | H01L 29/1608 |
| 11,817,304 B2* | 11/2023 | Wang | H01L 21/78 |
| 2007/0111480 A1* | 5/2007 | Maruyama | B23K 26/18 257/E21.599 |
| 2011/0132885 A1* | 6/2011 | Sercel | B23K 26/0738 219/121.72 |
| 2014/0038392 A1* | 2/2014 | Yonehara | B42D 25/00 438/463 |
| 2020/0211837 A1* | 7/2020 | Espina | H01L 21/78 |
| 2021/0327757 A1 | 10/2021 | Nagaya et al. | |
| 2022/0020705 A1* | 1/2022 | Loh | H01L 21/6836 |

* cited by examiner

METHOD FOR SEPARATING DIES FROM A SEMICONDUCTOR SUBSTRATE

TECHNICAL FIELD

The present disclosure relates to a method for separating dies from a semiconductor substrate, in particular to a method for separating dies from one another along a separation area defined by modifications of the semiconductor substrate.

BACKGROUND

Wafer costs make up a significant ratio of the overall production costs of semiconductor devices. Reducing these costs yield a competitive advantage. One way to reduce wafer costs is to use a semiconductor substrate, e.g. a wafer, at least twice-after producing device structures, the semiconductor substrate is split and a reclaimed wafer part that does not include the device structures is re-used to form additional device structures. Integrating semiconductor substrate splitting into a standard production process is involved and complex, and requires changes/modification to the production process to yield efficient production of dies from a semiconductor substrate.

Thus, there is a need for separating dies from a semiconductor substrate in an efficient and cost sensitive manner.

SUMMARY

An example of the present disclosure relates to a method for separating dies from a semiconductor substrate. The method includes providing a semiconductor substrate comprising dies adjoining to a first surface of the semiconductor substrate. The method further includes attaching the semiconductor substrate to a carrier via the first surface. The method further includes generating first modifications in the semiconductor substrate by introducing laser radiation into an interior of the semiconductor substrate via a second surface of the semiconductor substrate, the second surface being opposite to the first surface. The first modifications extend between the first surface and a vertical level in the interior of the semiconductor substrate. The vertical level is spaced from the second surface. The first modifications laterally surround the dies. The method further includes generating second modifications in the semiconductor substrate by introducing laser radiation into an interior of the semiconductor substrate via the second surface of the semiconductor substrate. The second modifications sub-divide the semiconductor substrate into a first part between the first surface and the second modifications, and a second part between the second surface and the second modifications. The method further includes separating the first part of the semiconductor substrate from the second part of the semiconductor substrate along a first separation area defined by the second modifications. The method further includes separating the dies from one another along a second separation area defined by the first modifications.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of separating dies from a semiconductor substrate and together with the description serve to explain principles of the examples. Further examples are described in the following detailed description and the claims.

DETAILED DESCRIPTION

Figure 1A:
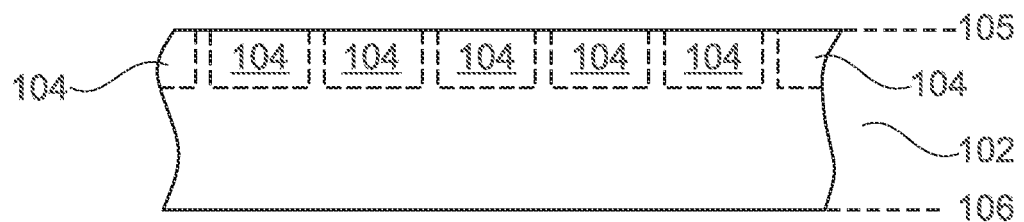
FIGS. 1A to 1F are schematic cross-sectional views for illustrating process features of separating dies from a semiconductor substrate.

In the following detailed description, reference is made to the accompanying drawings, which form a part hereof and in which are shown by way of illustrations specific examples of methods for separating dies from a semiconductor substrate. It is to be understood that other examples may be utilized and structural or logical changes may be made without departing from the scope of the present disclosure. For example, features illustrated or described for one example can be used in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

Ranges given for physical dimensions include the boundary values. For example, a range for a parameter y from a to b reads as a≤y≤b. The same holds for ranges with one boundary value like "at most" and "at least".

The terms "on" and "over" are not to be construed as meaning only "directly on" and "directly over". Rather, if one element is positioned "on" or "over" another element (e.g., a layer is "on" or "over" another layer or "on" or "over" a substrate), a further component (e.g., a further layer) may be positioned between the two elements (e.g., a further layer may be positioned between a layer and a substrate if the layer is "on" or "over" said substrate).

The adjectives "first", "second" may be used herein for distinguishing between features that are designated by the same term, e.g. first/second modifications or first/second separation area. The adjectives do not preclude the sequence of manufacture of the features. Thus, the first modifications may be formed before or after forming the second modifications.

An example of the present disclosure relates to a method for separating dies from a semiconductor substrate. The method may include providing a semiconductor substrate comprising dies adjoining to a first surface of the semiconductor substrate. The method may further include attaching the semiconductor substrate to a carrier via the first surface. The method may further include generating first modifications in the semiconductor substrate by introducing laser irradiation into an interior of the semiconductor substrate via a second surface of the semiconductor substrate. The second surface is opposite to the first surface. The first modifications may extend between the first surface and a vertical level in the interior of the semiconductor substrate. The vertical level is spaced from the second surface. The first modifications may laterally surround the dies. The method may further include generating second modifications in the semiconductor substrate by introducing laser irradiation into an interior of the semiconductor substrate via the second surface of the semiconductor substrate. The second modifications may sub-divide the semiconductor substrate into a first part between the first surface and the second modifications, and a second part between the second surface and the second modifications. The method may further include separating the first part of the semiconductor substrate from the second part of the semiconductor substrate along a first separation area defined by the second modifications. The method may further include separating the dies from one another along a second separation area defined by the first modifications.

The dies may each include a semiconductor device that may be an integrated circuit, or a discrete semiconductor device, for example. The integrated circuit or semiconductor device may be or may include a power semiconductor device, e.g. a vertical power semiconductor device having a load current flow between a first surface and a second surface. The dies may be used in automotive, industrial power control, power management, sensing solutions and security in Internet of Things applications, for example. The dies may be or may include a power semiconductor diode, or a power semiconductor IGBT (insulated gate bipolar transistor), or a reverse conducting (RC) IGBT, or a power semiconductor transistor such as a power semiconductor IGFET (insulated gate field effect transistor, e.g. a metal oxide semiconductor field effect transistor). For example, a power semiconductor device in the dies may be configured to conduct currents of more than 1 A or more than 10 A or even more than 30 A. The semiconductor device in the dies may be further configured to block voltages between load terminals, e.g. between emitter and collector of an IGBT, or between cathode and anode of a diode, or between drain and source of a MOSFET, in the range of several tens, or several hundreds or up to several thousands of volts, e.g. 30V, 40V, 60V, 80V, 100V, 400 V, 650V, 1.2 kV, 1.7 kV, 3.3 kV, 4.5 kV, 5.5 kV, 6 kV, 6.5 kV, 10 kV.

The examples described herein are directed to a semiconductor substrate separation process that reduces manufacturing costs associated with manufacturing semiconductor devices in dies. While some examples are related to SiC semiconductor substrates and SiC devices produced using SiC semiconductor substrates, the examples described herein are not intended to be limited to SiC semiconductor substrates and may be used with other semiconductor substrate technologies such as silicon (Si), gallium arsenide (GaAs), gallium nitride (GaN), sapphire, etc. Device structures may be formed in a base (thick) semiconductor substrate and the base semiconductor substrate is subsequently separated into a thinner device substrate, e.g. the first part of the semiconductor substrate, which includes the dies comprising device structures, and a thinner reclaimed semiconductor substrate, e.g. the second part of the semiconductor substrate. The reclaimed semiconductor substrate may be processed again and further devices may be formed within the reclaimed semiconductor substrate, for example.

The first surface may be a front surface or a top surface of the semiconductor substrate, and the second surface may be a back surface or a rear surface of the semiconductor substrate for example. Processing of the dies at the first surface of the semiconductor substrate may be finalized or completed before the separation processes of the semiconductor substrate.

Processes for defining the dies adjoining to the first surface of semiconductor substrate may include, for example, at least one doping process for forming doped regions in the semiconductor substrate at the first surface. The at least one doping process may include an ion implantation process followed by a thermal activation of dopants, a diffusion process introducing the dopants into the semiconductor substrate from a dopant source (e.g. solid or gaseous diffusion source), an in-situ doping process when forming a semiconductor layer, e.g. by a layer deposition process, on a semiconductor base substrate such as a wafer. The exemplary doping processes may be combined in any way and may be repeated in any way, e.g. depending on a desired number and profile of the doped regions that are to be formed in the semiconductor substrate at the first surface. Exemplary doped regions are source and drain regions, or emitter and collector regions, body region(s), body contact region(s), current spread region(s), shielding region(s) configured to shield a gate dielectric from high electric fields, field stop region(s). The processes may also include trench etch processes. The trench etch processes may be used to form trenches such as gate electrode trenches, field electrode trenches, multi-electrode trenches (e.g. combining gate and field electrodes in one trench), trenches for edge termination structures, contact trenches for providing an electric contact to doped regions in the semiconductor substrate. The processes may also include forming insulating layer(s), conductive layer(s), or any combination thereof, in the trenches. Exemplary insulating or conductive layers include, inter alia, gate or field electrodes by doped semiconductor layers (e.g. doped polycrystalline silicon, or metal, or metal alloy), oxide layers (e.g. silicate glass, deposited $SiO_2$, thermal $SiO_2$), nitride layers (e.g., $Si_3N_4$), high-k dielectric layers, low-k dielectric layers, dielectric spacers, or any combination thereof.

Processes for defining the dies adjoining to the first surface of semiconductor substrate may further include, for example, processes for forming a wiring area of the semiconductor substrate at the first surface. Forming a wiring area may include forming one or more than one, e.g. two, three, four or even more wiring levels. Each wiring level may be formed by a single one or a stack of conductive layers, e.g. metal layer(s). For example, the wiring levels may include at least one of Cu, Au, AlCu, Ag, or alloys thereof. The wiring levels may be lithographically patterned, for example. Between stacked wiring levels, an interlayer dielectric structure may be formed. Openings may be formed in the interlayer dielectric structure for electrically interconnecting different wiring layers. For example, contact plug(s), or contact via(s) or contact line(s) may be formed in the openings in the interlayer dielectric structure to electrically connect parts, e.g. metal lines or contact areas, of different wiring levels to one another. The wiring area may be arranged over an active area of the dies in the semiconductor substrate. In some examples, apart from the active area, the dies may also include an edge termination area that at least partly surrounds the active area. The edge termination area may include a termination structure. In a blocking mode or in a reverse biased mode of the semiconductor device, the blocking voltage between the active area and a field-free region laterally drops across the termination structure. The termination structure may include a junction termination extension (JTE) with or without a variation of lateral doping (VLD), one or more laterally separated guard rings, or any combination thereof, for example.

The carrier may be temporarily (reversibly) attached to the semiconductor substrate via the first surface of the semiconductor substrate. The carrier may include an adhesive or glue (organic or inorganic composition) layer in combination with a rigid support such as a transparent substrate, e.g. glass substrate.

The first modifications defining the second separation area in the semiconductor substrate may be generated by damaging material of the semiconductor substrate at a targeted position in the interior of the semiconductor substrate. Below details likewise apply to generation of the second modifications for defining the first separation area. Although the laser radiation enters the semiconductor substrate from the second surface, the first modifications are generated around the dies adjoining to the first surface. In other words, the first modifications are generated closer to the first surface than to the second surface from where the laser irradiation enters into the semiconductor substrate. For example, in the case of SiC as the substrate material, the SiC material may be damaged. In some cases, SiC may be at least partially decomposed, for instance, into Si and C. This may be done, e.g., by creating a plasma in the SiC material at the targeted position within the semiconductor substrate. At least some of the atoms in the plasma may reform to carbon clusters and silicon material, e.g., in the form of amorphous carbon and/or amorphous silicon. In addition or as an alternative, at least some of the atoms may re-crystallize, semi-crystallize and/or re-organize, for example to at least one polytype of SiC (e.g., 4H-SiC, 6H-SiC, or 3C-SiC) or amorphous SiC where both Si and C phases are amorphous. In some examples, the separation region may comprise at least one of crystalline portions of at least one polytype of SiC or silicon or carbon (e.g., in the form of microcrystalline), amorphous portions of SiC or silicon or carbon, and/or cavities.

For example, a plasma may be created in the material at the targeted position, i.e. the position where the first modification is to be formed, within the semiconductor substrate by focusing laser radiation at the targeted position within the semiconductor substrate. The laser radiation introduced into the semiconductor substrate via the second surface may be focused to a well-defined region within the semiconductor substrate to ignite a plasma within the semiconductor substrate which decomposes the laser irradiated semiconductor material into its constituent components. For example, in the case of SiC, laser irradiated SiC decomposes as follows: SiC→Si+C. The interaction with the laser radiation may result in a different material phase, e.g., as described above, and/or in microscopic cracks within the semiconductor substrate. Irradiating the semiconductor wafer with the laser radiation is carried out after processing the dies at the first surface of the semiconductor substrate. Since the laser radiation enters the semiconductor substrate from the second surface of the semiconductor substrate, damage of the wiring area over the first surface of the semiconductor substrate can be avoided.

For example, the laser irradiation may be in an off-resonant regime such that a probability of single-photon processes in the second separation area is small and mostly multi-photon processes (in particular, multi-photon absorption) may have to be accounted for. For example, the off-resonant regime may be achieved if the band gap of the separation area is larger than (e.g., at least twice of or at least ten times of) the photon energy of the laser radiation. In the case of a multi-photon process, damage creation may be further supported by a pre-defined layer (e.g., formed by ion implantation) that increases absorption within the region where the focal point of the laser radiation is positioned. The laser irradiation may be pulsed laser radiation. The parameters of the laser radiation such as pulse duration, repetition rate, pulse energy, intensity, wavelength, pulse shape, polarization, etc. are interconnected and may be optimized according to a specific application or requirement. For example, the laser radiation may have a pulse duration of 100 fs to 100 ns (e.g. 50 ps to 10 ns), a repetition rate of 10 kHz to 10 MHz, a pulse energy of 100 nJ to 50 µJ, and a peak wavelength of 400 nm to 2100 nm (e.g., 900 nm to 1200 nm).

The examples described herein for separating dies from a semiconductor substrate allow for a number of technical benefits. Defining the second separation area for die separation before separating the semiconductor substrate along the first separation area defined by the first modifications allows for avoiding mechanical dicing or ablation laser dicing which may be a source of defect generation. Moreover, kerf losses may be avoided. By defining separation areas by first and second modifications via laser irradiation through the second surface of the substrate, damage to a wiring area of the dies at the first surface of the semiconductor substrate can be avoided.

For example, the second modifications may be generated after generating first modifications. According to another example, the first modifications may be generated after generating the second modifications.

For example, attaching the semiconductor substrate to the carrier via the first surface may include attaching the semiconductor substrate to the carrier by a glue arranged between the first surface of the semiconductor substrate and the carrier. At least part of the carrier may be shaped as a grid. Grid lines of the grid and the first modifications may be aligned to one another in a plan view. For example, the first modifications may be arranged directly below the grid lines.

For example, the method may further include, before separating the dies from one another, testing the dies by accessing the dies with a test equipment through openings in the grid. For example, one or more tester needles or a probe card of a wafer prober may be brought into electrical contact with a test pad on the dies by placing the one or more tester needles or the probe card of a wafer prober in the openings of the grid. For example, the test equipment may be brought into electrical contact with process control monitor structures, PCM structures, of the die. The PCM structures may be arranged in an edge area of the die. The die may also include test pads in addition to the functional pads of the die, e.g. in addition to source or emitter pads, for example. The dies may also be electrically accessed from a side opposite to the first surface where the grid is attached, e.g. via a separation surface of the first part of the semiconductor substrate that may have been processed in advance, e.g. by planarization and contact layer formation processes. For example, the dies may be placed on a chuck via the processed separation surface of the first part of the semiconductor substrate, for example. Testing the dies through the openings of the grid-shaped carrier may allow for mechanical stabilization when handling thin substrates for characterizing and controlling the manufactured technology in reference to the technology specification, for example.

For example, the method may further include dicing through the carrier along the grid lines. Dicing may be carried out by a suitable dicing equipment including, for example, a dicing blade. The dicing process may define cutouts in the grid that may be arranged directly over the first modifications between neighboring dies.

For example, the carrier may be a glass carrier, or any other carrier formed of, for example, an organic, inorganic, or hybrid material.

For example, the second modifications may be generated at a vertical distance to the first modifications. The vertical distance may be larger than 5 μm, for example.

For example, the first separation area may be a separation area arranged in parallel to the second surface. A separation surface or plane in the first separation area may include segments that are slightly inclined with respect to a plane parallel to the second surface. This may result in a separation surface having, for example, a saw tooth pattern or zig-zag shape caused by an interrelationship between crack propagation and crystal lattice structure of the semiconductor substrate, for example.

For example, a vertical distance from the second surface to the second separation area may exceed a vertical distance from the first surface to the second modification area by a factor ranging from of 1.5 to 30, or by a factor ranging from 2 to 20. This may allow for a reuse of the second part of the semiconductor substrate for future semiconductor device processes including, for example, wafer splitting processes such as described herein.

For example, an arrangement of the first modifications may be a grid in a plan or top view. The grid openings in the plan or top view may be rectangular or may have a similar shape as the dies, for example. The first modifications of a group of the first modifications may be spaced from one another along a vertical direction. A vertical and lateral distance between neighboring first modifications may be small enough for allowing a subsequent separation of the dies along the second separation area defined by the first modifications by a suitable separation process, e. g. by expansion of a tape having the dies in the first part of the semiconductor substrate laminated thereon.

For example, after separating the first part of the semiconductor substrate from the second part of the semiconductor substrate and before separating the dies from one another, a conductive contact structure may be formed on a separation surface of the first part of the semiconductor substrate. The separation surface is the surface of the first part of the semiconductor substrate that is opposite to the surface of the first part of the semiconductor substrate attached to the carrier. Before forming the conductive contact structure, planarization of the separation surface may be carried out. Planarizing the separation surface may include mechanical machining, e.g. grinding. For example, planarizing the separation surface may include removing material of the first part of the semiconductor substrate at least up to the first modifications.

For example, separating the first part of the semiconductor substrate from the second part of the semiconductor substrate may include applying an external force to the semiconductor substrate such that at least one crack propagates along the first separation area and splits the semiconductor substrate into the first part and the second part. For example, applying the external force to the semiconductor substrate may include applying a polymer to the second surface of the semiconductor substrate. The polymer may have a coefficient of thermal expansion, CTE, different from a CTE of the semiconductor substrate. Applying the external force to the semiconductor substrate may further include subjecting the polymer and the semiconductor substrate to a temperature process during which the polymer imparts mechanical stress to the semiconductor substrate. The polymer may be selected based not only on CTE, but also by taking into account multiple parameters. The CTE of the polymer should be different from the CTE of the semiconductor substrate. For example, the CTE of the polymer is preferably larger than the CTE of the semiconductor substrate. In addition to the CTE difference, the linear course of the CTE in the polymer over a wide temperature range may be advantageous for successful separation. Furthermore, the polymer may have sufficiently high thermal conductivity. For example, one or more fillers such as ZnO and/or carbon black may be added to the polymer before the temperature process. The filler(s) may increase the thermal conductivity of the polymer and may reduce a slope of a storage modulus of the polymer, extending the linear course of the CTE in the polymer over a smaller temperature range. By adding ZnO and/or carbon black to the polymer, percolation chains that form can significantly increase thermal conductivity in the polymer. If a filler material is used, the polymer material may be chosen such that the filler material is easily homogeneously distributed throughout the polymer. For sufficiently large coefficients of heat transfer to the semiconductor substrate, adding one or more fillers such as ZnO and/or carbon black to the polymer reduces by more than half the time needed to achieve a temperature differential that generates sufficient mechanical stress for splitting the semiconductor substrate along the first separation area. At the same time, the rise in modulus of elasticity is distributed over a greater temperature range since it is already apparent at higher temperatures by comparison with an unfilled polymer. As a result, there is less wafer breakage in the manufacturing process and a higher split efficiency is provided. One example for the polymer is PDMS (polydimethylsiloxane), usually with at least one filler. PDMS may generate high adhesion to a surface. Attaching may thus require some pre-processing or conditioning to allow for damage-free polymer removal. For example, a foil may be positioned between the polymer and the surface to which the polymer is attached.

Attaching the polymer is typically performed at higher temperatures (e.g., above room temperature but below 300° C.). A binding process may be applied to allow for a firm bond throughout the entire temperature process. For example, before applying the polymer, the application surface of the polymer and/or semiconductor substrate may undergo chemical and/or physical surface treatment (for example, with a plasma) to allow for firm bonding. An indirect temporary cold plasma activation process may be used to ensure subsequent easy removal of the polymer. This has the advantage that ambivalent characteristics of the structure-property relationships are achievable here and that no significant thermal diffusion processes are to be expected at the low temperatures that occur.

For example, the temperature process may be selected such that the polymer undergoes a partial glass transition and a partial crystallization during the temperature process. This may include a first phase during which the polymer and the semiconductor substrate undergo a temperature gradient from a starting temperature down to room temperature, the starting temperature being 300° C. or less but above room temperature, and a second phase during which the polymer and the semiconductor substrate are further cooled down to a lower temperature. For example, the lower temperature may correspond to +40° C. of a boiling temperature of a cooling liquid (e.g., liquid nitrogen) used for cooling. The lower temperature may be, for example, −170° C., in particular for the entire semiconductor substrate. In some examples, the lower temperature may be below a glass transition temperature (Tg) of the polymer, depending on the cooling conditions (e.g., the cooling liquid).

In addition to, or as an alternative to, using a polymer for the separation process, the external force applied to the semiconductor substrate for separating the first part of the semiconductor substrate from the second part of the semiconductor substrate may include applying ultrasonic vibrations (sound waves) to the semiconductor substrate. The ultrasonic vibrations may have a frequency in the kHz regime, e.g., at least 20 kHz and at most 60 kHz (e.g., 30-50 kHz, e.g. 35-45 kHz). The semiconductor substrate may be placed in a container filled with a fluid such as pure water, deionized water, solvents in general, dimethylformamide, isopropyl alcohol, methanol, and/or ethanol when applying the ultrasonic vibrations. For example, a device similar to an ultrasonic cleaning apparatus may be used to apply the ultrasonic waves to the semiconductor substrate.

For example, the semiconductor substrate may be a SiC wafer, and the separation surface may have a saw-tooth pattern. For 4H—SiC, the growth direction of the semiconductor substrate, which corresponds to the vertical direction along which the semiconductor substrate has a thickness, may be slightly tilted to the main crystal axis, typically by 4° (also referred to as off-axis angle). Therefore, the crystal planes are tilted. If the first separation area were to have only a single large second modification, e.g. crack, which would be planar but tilted, the first separation region would be tilted by 4° with respect to the lateral directions (i.e., the directions perpendicular to the vertical direction). Along the entire diameter of the semiconductor substrate this would result in tremendous losses. Accordingly, for SiC, the splitting process may be useful for 4H—SiC if the separation surface or plane is not planar but has a zig-zag shape/saw-tooth shape. The second modifications, e.g. microscopic cracks, may be subsequently connected to enable splitting of the semiconductor substrate during application of the external force for separating the first part of the semiconductor substrate from the second part of the semiconductor substrate.

For example, separating the dies from one another may include attaching the first part of the semiconductor substrate to a tape via the separation surface and expanding the tape along a lateral direction. Expanding the tape along the lateral direction may impart tensile stress to the first part of the semiconductor substrate. Similar to the separation process along the first separation area by subsequently connecting the second modifications, separation of the dies from one another may be caused by subsequently connecting the first modifications, e.g. microscopic cracks, in the second separation area, e.g. vertically and laterally.

The examples and features described above and below may be combined. Functional and structural details (e.g. materials, dimensions) described with respect to the examples above shall likewise apply to the examples illustrated in the figures and described further below.

More details and aspects are mentioned in connection with the examples described above or below. Processing a semiconductor body, e.g. a wafer, may comprise one or more optional additional features corresponding to one or more aspects mentioned in connection with the proposed concept or one or more examples described above or below.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

FIGS. 1A to 1F are schematic cross-sectional views for illustrating exemplary process features of a method for separating dies from a semiconductor substrate.

Referring to the schematic cross-sectional view of FIG. 1A, semiconductor dies 104 are formed at a first surface 105 of a semiconductor substrate 102. Formation of the dies 104 includes semiconductor manufacturing processes at the first surface 105 for defining an active area and a wiring area at the first surface 105 of the semiconductor substrate 102, for example.

Figure 1B:
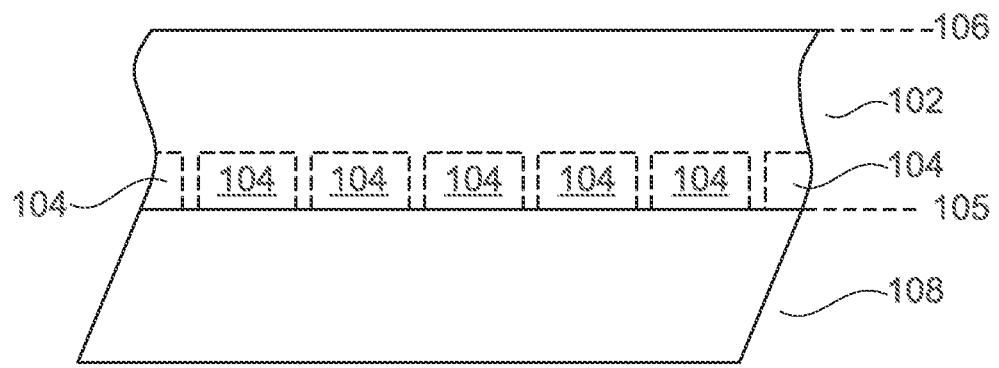

Referring to the schematic cross-sectional view of FIG. 1B, the semiconductor substrate 102 is attached to a carrier 108, e.g. a glass carrier, via the first surface 105.

Figure 1C:
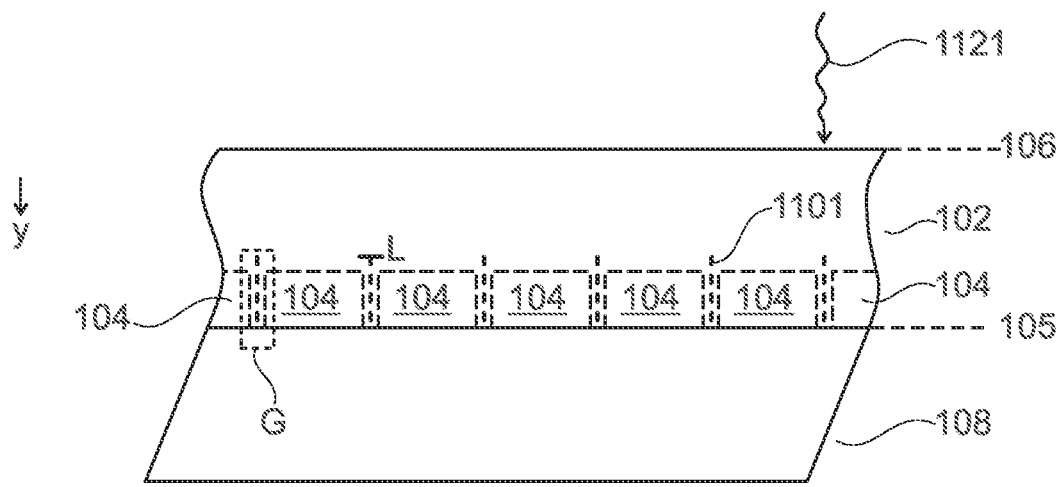

Referring to the schematic cross-sectional view of FIG. 1C, first modifications 1101 are formed in the semiconductor substrate by introducing laser radiation 1121 into an interior of the semiconductor substrate 102 through a second surface 106 of the semiconductor substrate. The second surface 106 is opposite to the first surface 105 where the dies 104 are located. The first modifications 1101 extend between the first surface 105 and a vertical level L in the interior of the semiconductor substrate 102. The vertical level has a distance to the second surface 106. First modifications 1101 of a group G of the first modifications are spaced from one another along a vertical direction y.

Figure 1D:
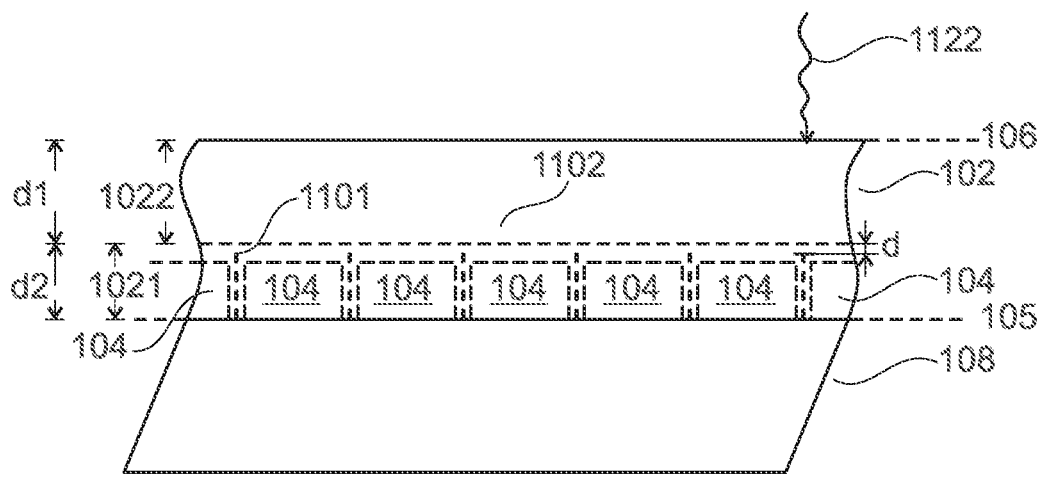

Referring to the schematic cross-sectional view of FIG. 1D, second modifications 1102 are generated in the semiconductor substrate 102 by introducing laser radiation 1122 into an interior of the semiconductor substrate 102 through the second surface 106 of the semiconductor substrate 102. The second modifications 1102 sub-divide the semiconductor substrate 102 into a first part 1021 between the first surface 105 and the second modifications 1102, e.g. a device substrate or device wafer, and a second part 1022 between the second surface 106 and the second modifications 1102, e.g. a reclaimed substrate or reclaimed wafer. A vertical distance d1 from the second surface 106 to the second modifications 1102 of the first separation area exceeds a vertical distance d2 from the first surface 105 to the second modifications 1102 of the first separation area, e.g. by a factor ranging from of 1.5 to 30.

The sequence of forming the first and second modifications 1101, 1102 illustrated in FIG. 1C, 1D may also be reversed.

Figure 1E:
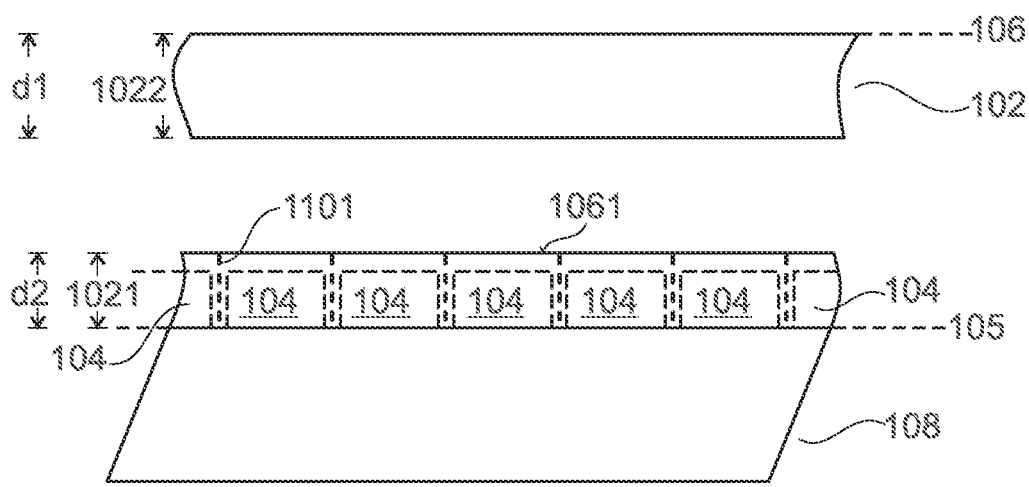

Referring to the schematic cross-sectional view of FIG. 1E, the first part 1021 of the semiconductor substrate 102 is separated from the second part 1022 of the semiconductor substrate 102 along a first separation area defined by the second modifications 1102. After separating the first part 1021 of the semiconductor substrate 102 from the second part 1022 of the semiconductor substrate 102, a separation surface 1061 may be processed. For example, the separation surface 1061 may be planarized and an electric contact may be formed on the separation surface 1061.

Figure 1F:
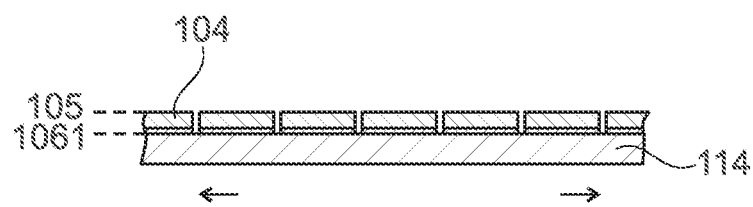

The schematic cross-sectional view of FIG. 1F illustrates an example of separating the dies 104 from one another along a second separation area defined by the first modifications 1101. The first part 1021 of the semiconductor substrate 102 is attached to a tape 114 via the separation surface 1061 and the carrier 108 is removed from the first surface 105. The separation process is initiated by expanding the tape 114 along a lateral direction x. When expanding the tape 114 along the lateral direction x, tensile stress is imparted to the first part 1021 of the semiconductor substrate 102 and separates the dies from one another along the second separation area defined by the first modifications 1101. The dies may be picked and further processed, e.g. by chip packaging, for example.

The schematic cross-sectional views of FIGS. 2A to 2D illustrate more detailed and/or additional process features in relation to the exemplary method described with reference to FIGS. 1A to 1F.

Figure 2A:
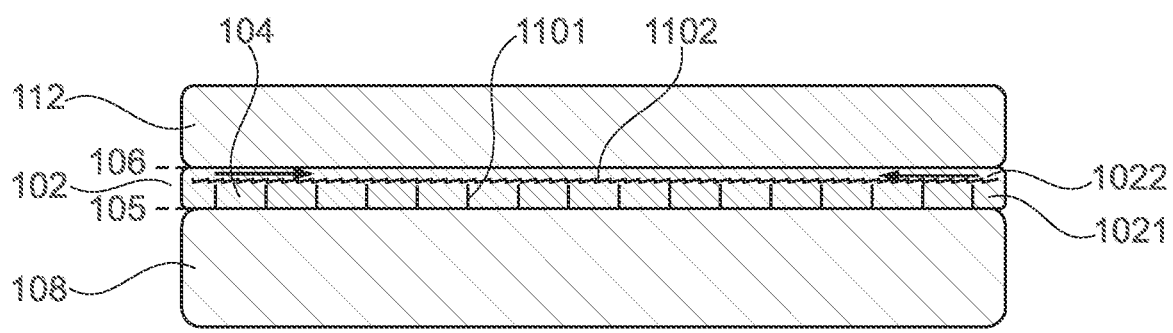
FIGS. 2A to 2D are schematic cross-sectional views for illustrating more detailed and/or additional process features in relation to the exemplary process features described with reference to FIGS. 1A to 1F.
Figure 2B:
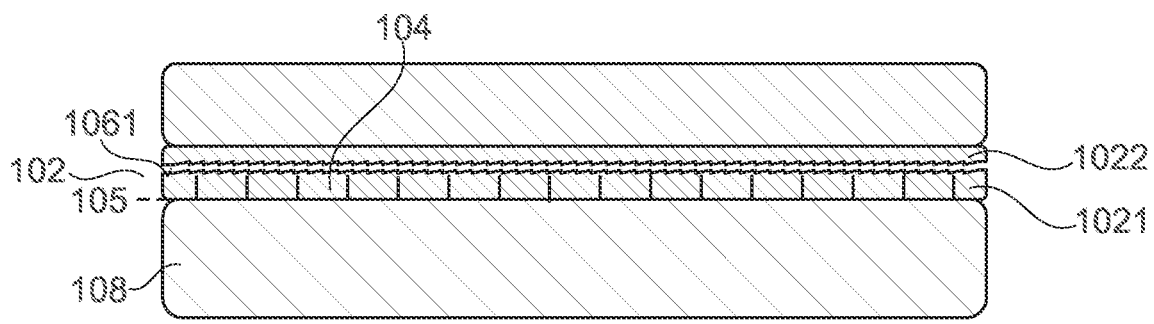

Referring to FIGS. 2A and 2B, a polymer 112 is attached to the second surface 106 of the semiconductor substrate 102. The polymer 112 has a coefficient of thermal expansion, CTE, different from the CTE of the semiconductor substrate 102. When subjecting the polymer 112 and the semiconductor substrate 102 to a temperature process, the polymer imparts mechanical stress to the semiconductor substrate 102 (schematically indicated by arrows in FIG. 2A). Thereby, propagation of at least one crack along the first separation area defined by second modifications 1102 is initiated and the semiconductor substrate 102 is split into the first part 1021 and the second part 1022.

Figure 2C:
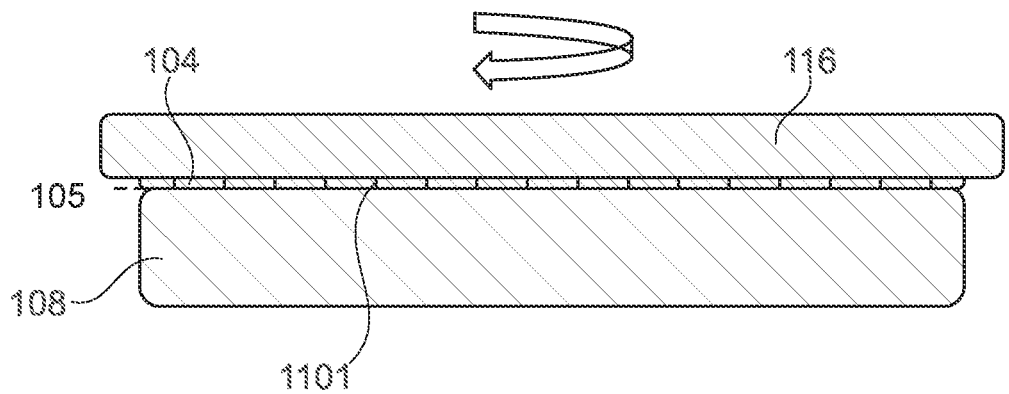
Figure 2D:
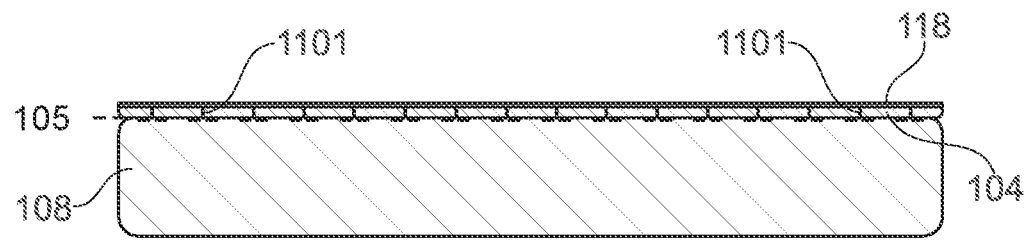

Referring to FIGS. 2C and 2D, after separating the semiconductor substrate 102 into the first part 1021 and the second part 1022, the separation surface 1061 of the first part 1021 is planarized by, for example, mechanical machining using a grinding wheel 116 (see FIG. 2C). Material of the first part 1021 of the semiconductor substrate 102 may be removed at least up to the first modifications 1021. After planarizing the separation surface 1061, a conductive contact structure 118, e.g. a metal layer or metal layer stack, is formed on the separation surface 1061 of the first part 1021 of the semiconductor substrate 102.

Figure 3:
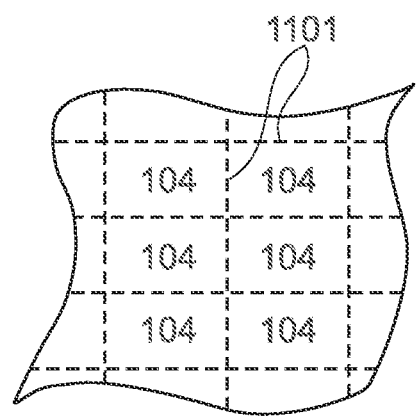
FIG. 3 is a schematic top view for schematically illustrating first modifications laterally surrounding dies.

The schematic top view of FIG. 3 schematically illustrates the first modifications 1101 laterally surrounding the dies 104.

Figure 4A:
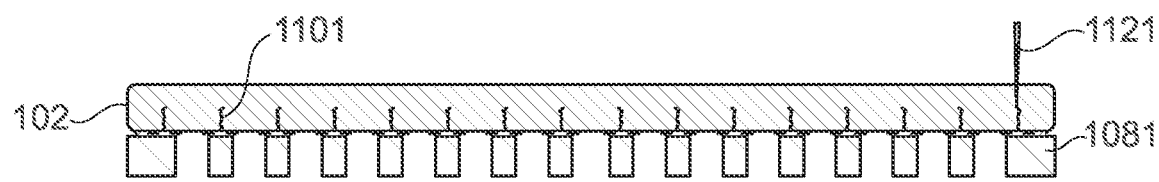
FIGS. 4A and 4B are related to the process features illustrated in FIGS. 1C, 1D with a grid-shaped carrier.
Figure 4B:
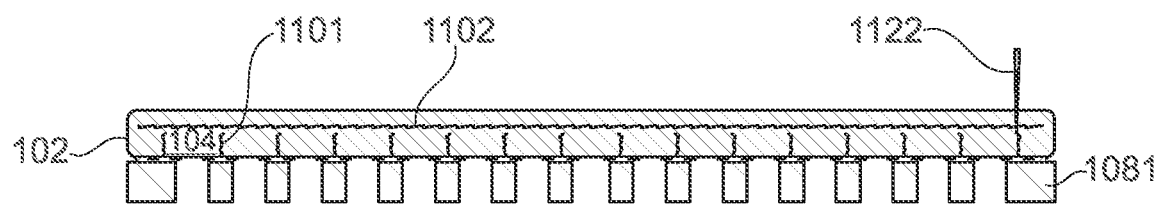

The schematic cross-sectional views of FIGS. 4A and 4B are based on the process features of FIGS. 1C, 1D and illustrate another example of a carrier 1081 that is shaped as a grid, wherein grid lines of the grid and the first modifications are aligned to one another in a plan view. Details described with reference to process features based on the carrier 108 in FIGS. 1A to 1F and 2A to 2D likewise apply to the grid-shaped carrier 1081 of FIGS. 4A, 4B.

The grid-shaped carrier 1081 allows for testing the dies 104 by accessing the dies 104 with a test equipment, e.g. a tester needle 120, through openings in the grid-shaped carrier 1081. The dies 104 may be mounted on a support table 122, e.g. a chuck, that may further provide an electrical contact to the conductive contact structure 118.

Figure 5:
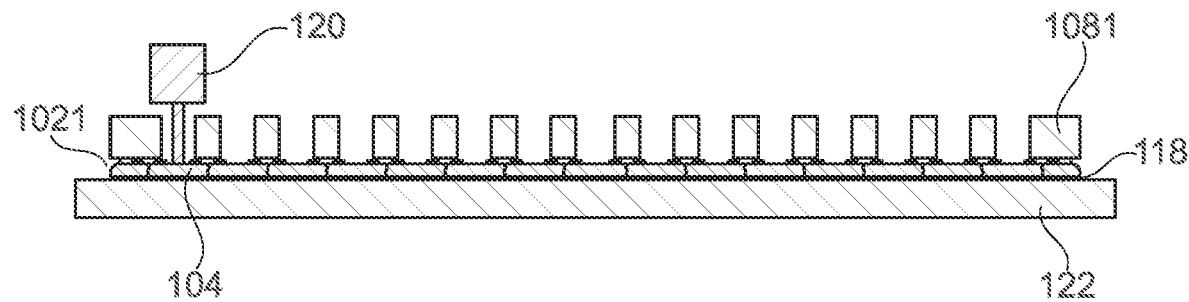
FIG. 5 is a schematic cross-sectional view for illustrating die testing through openings in the grid-shaped carrier.
Figure 6A:
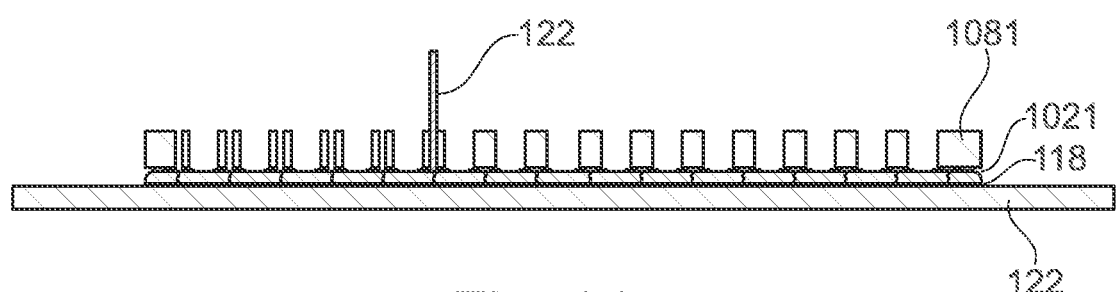
FIGS. 6A and 6B are schematic cross-sectional views for illustrating an example of dicing through grid lines and subsequent separation of the dies from one another.
Figure 6B:
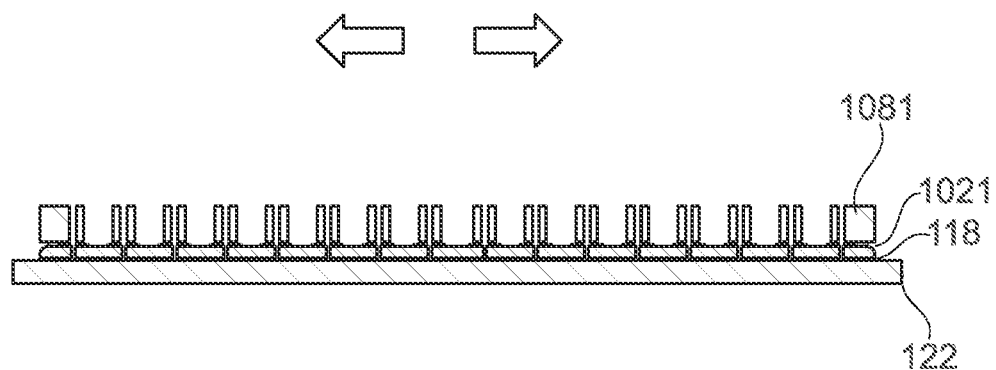

Referring to the schematic cross-sectional views of FIGS. 6A and 6B, the grid-shaped carrier 1081 is mounted on a tape 114, e.g. after testing as illustrated in FIG. 5, and the grid-shaped carrier 1081 is processed by dicing through the carrier 1081 along the grid lines (see FIG. 6A), e.g. by a dicing blade 122. Similar to the process feature described with reference to FIG. 1F, the dies 104 are separated from one another along the second separation area defined by the first modifications 1101 by expanding the tape 114.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method for separating dies from a semiconductor substrate, the method comprising:
   providing a semiconductor substrate comprising a plurality of dies adjoining to a first surface of the semiconductor substrate;
   attaching the semiconductor substrate to a carrier via the first surface;
   generating a plurality of first modifications in the semiconductor substrate by introducing laser radiation into an interior of the semiconductor substrate via a second surface of the semiconductor substrate, the second surface being opposite to the first surface, wherein the first modifications extend between the first surface and a vertical level in the interior of the semiconductor substrate, the vertical level being spaced from the second surface, and wherein the first modifications laterally surround the dies;
   generating a plurality of second modifications in the semiconductor substrate by introducing laser radiation into the interior of the semiconductor substrate via the second surface of the semiconductor substrate, the second modifications sub-dividing the semiconductor substrate into a first part between the first surface and the second modifications, and a second part between the second surface and the second modifications, wherein the second modifications are generated at a vertical distance to the first modifications;
   separating the first part of the semiconductor substrate from the second part of the semiconductor substrate along a first separation area defined by the second modifications; and
   separating the dies from one another along a second separation area defined by the first modifications,
   wherein the first modifications are generated after generating the second modifications,
   wherein attaching the semiconductor substrate to the carrier via the first surface comprises attaching the semiconductor substrate to the carrier by a glue arranged between the first surface of the semiconductor substrate and the carrier,
   wherein at least part of the carrier is shaped as a grid,
   wherein grid lines of the grid and the first modifications are aligned to one another in a plan view.

2. The method of claim 1, further comprising:
   before separating the dies from one another, testing the dies by accessing the dies with a test equipment through openings in the grid.

3. The method of claim 1, further comprising:
   dicing through the carrier along the grid lines.

4. The method of claim 1, wherein the carrier is a glass carrier.

5. The method of claim 1, wherein the vertical distance is larger than 5 µm.

6. The method of claim 1, wherein the first separation area is a separation area arranged in parallel to the second surface.

7. The method of claim 1, wherein a vertical distance from the second surface to the first separation area exceeds a vertical distance from the first surface to the first separation area by a factor ranging from 1.5 to 30.

8. The method of claim 1, wherein an arrangement of the first modifications is a grid in a plan view, and wherein first modifications of a group of the first modifications are spaced from one another along a vertical direction.

9. The method of claim 1, further comprising:
after separating the first part of the semiconductor substrate from the second part of the semiconductor substrate and before separating the dies from one another, forming a conductive contact structure on a separation surface of the first part of the semiconductor substrate,
wherein the separation surface is the surface of the first part of the semiconductor substrate that is opposite to the surface of the first part of the semiconductor substrate attached to the carrier.

10. The method of claim 9, further comprising:
before forming the conductive contact structure, planarizing the separation surface,
wherein planarizing the separation surface comprises mechanical machining.

11. The method of claim 10, wherein planarizing the separation surface comprises removing material of the first part of the semiconductor substrate at least up to the first modifications.

12. The method of claim 1, wherein separating the first part of the semiconductor substrate from the second part of the semiconductor substrate comprises applying an external force to the semiconductor substrate such that at least one crack propagates along the first separation area and splits the semiconductor substrate into the first part and the second part.

13. The method of claim 12, wherein applying the external force to the semiconductor substrate comprises:
applying a polymer to the second surface of the semiconductor substrate, the polymer having a coefficient of thermal expansion (CTE) different from a CTE of the semiconductor substrate; and
subjecting the polymer and the semiconductor substrate to a temperature process during which the polymer imparts mechanical stress to the semiconductor substrate.

14. The method of claim 12, wherein the semiconductor substrate is a SiC wafer, and wherein the separation surface has a saw-tooth pattern.

15. The method of claim 1, wherein separating the dies from one another comprises attaching the first part of the semiconductor substrate to a tape via the separation surface and expanding the tape along a lateral direction.

16. The method of claim 15, wherein expanding the tape along the lateral direction imparts tensile stress to the first part of the semiconductor substrate.

17. A method for separating dies from a semiconductor substrate, the method comprising:
providing a semiconductor substrate comprising a plurality of dies adjoining to a first surface of the semiconductor substrate;
attaching the semiconductor substrate to a carrier via the first surface;
generating a plurality of first modifications in the semiconductor substrate by introducing laser radiation into an interior of the semiconductor substrate via a second surface of the semiconductor substrate, the second surface being opposite to the first surface, wherein the first modifications extend between the first surface and a vertical level in the interior of the semiconductor substrate, the vertical level being spaced from the second surface, and wherein the first modifications laterally surround the dies;
generating a plurality of second modifications in the semiconductor substrate by introducing laser radiation into the interior of the semiconductor substrate via the second surface of the semiconductor substrate, the second modifications sub-dividing the semiconductor substrate into a first part between the first surface and the second modifications, and a second part between the second surface and the second modifications, wherein the second modifications are generated at a vertical distance to the first modifications;
separating the first part of the semiconductor substrate from the second part of the semiconductor substrate along a first separation area defined by the second modifications;
separating the dies from one another along a second separation area defined by the first modifications; and
after separating the first part of the semiconductor substrate from the second part of the semiconductor substrate and before separating the dies from one another, forming a conductive contact structure on a separation surface of the first part of the semiconductor substrate,
wherein the separation surface is the surface of the first part of the semiconductor substrate that is opposite to the surface of the first part of the semiconductor substrate attached to the carrier.

18. The method of claim 17, further comprising:
before forming the conductive contact structure, planarizing the separation surface,
wherein planarizing the separation surface comprises mechanical machining.

19. The method of claim 18, wherein planarizing the separation surface comprises removing material of the first part of the semiconductor substrate at least up to the first modifications.

20. A method for separating dies from a semiconductor substrate, the method comprising:
providing a semiconductor substrate comprising a plurality of dies adjoining to a first surface of the semiconductor substrate;
attaching the semiconductor substrate to a carrier via the first surface;
generating a plurality of first modifications in the semiconductor substrate by introducing laser radiation into an interior of the semiconductor substrate via a second surface of the semiconductor substrate, the second surface being opposite to the first surface, wherein the first modifications extend between the first surface and a vertical level in the interior of the semiconductor substrate, the vertical level being spaced from the second surface, and wherein the first modifications laterally surround the dies;
generating a plurality of second modifications in the semiconductor substrate by introducing laser radiation into the interior of the semiconductor substrate via the second surface of the semiconductor substrate, the second modifications sub-dividing the semiconductor substrate into a first part between the first surface and the second modifications, and a second part between the second surface and the second modifications, wherein the second modifications are generated at a vertical distance to the first modifications;

separating the first part of the semiconductor substrate from the second part of the semiconductor substrate along a first separation area defined by the second modifications; and separating the dies from one another along a second separation area defined by the first modifications, wherein separating the first part of the semiconductor substrate from the second part of the semiconductor substrate comprises applying an external force to the semiconductor substrate such that at least one crack propagates along the first separation area and splits the semiconductor substrate into the first part and the second part, wherein applying the external force to the semiconductor substrate comprises:

applying a polymer to the second surface of the semiconductor substrate, the polymer having a coefficient of thermal expansion (CTE) different from a CTE of the semiconductor substrate; and subjecting the polymer and the semiconductor substrate to a temperature process during which the polymer imparts mechanical stress to the semiconductor substrate.

21. A method for separating dies from a semiconductor substrate, the method comprising:

providing a semiconductor substrate comprising a plurality of dies adjoining to a first surface of the semiconductor substrate;

attaching the semiconductor substrate to a carrier via the first surface;

generating a plurality of first modifications in the semiconductor substrate by introducing laser radiation into an interior of the semiconductor substrate via a second surface of the semiconductor substrate, the second surface being opposite to the first surface, wherein the first modifications extend between the first surface and a vertical level in the interior of the semiconductor substrate, the vertical level being spaced from the second surface, and wherein the first modifications laterally surround the dies;

generating a plurality of second modifications in the semiconductor substrate by introducing laser radiation into the interior of the semiconductor substrate via the second surface of the semiconductor substrate, the second modifications sub-dividing the semiconductor substrate into a first part between the first surface and the second modifications, and a second part between the second surface and the second modifications, wherein the second modifications are generated at a vertical distance to the first modifications;

separating the first part of the semiconductor substrate from the second part of the semiconductor substrate along a first separation area defined by the second modifications; and separating the dies from one another along a second separation area defined by the first modifications, wherein separating the first part of the semiconductor substrate from the second part of the semiconductor substrate comprises applying an external force to the semiconductor substrate such that at least one crack propagates along the first separation area and splits the semiconductor substrate into the first part and the second part, wherein the semiconductor substrate is a SiC wafer, wherein a separation surface of the first part of the semiconductor substrate has a saw-tooth pattern.

* * * * *